United States Patent [19]
Fukuzumi

[11] Patent Number: 6,126,070
[45] Date of Patent: Oct. 3, 2000

[54] IC MEMORY CARD WITH SECURITY CHECK

[75] Inventor: Tomoya Fukuzumi, Tokyo, Japan

[73] Assignee: Mitsubishi Denki Kabushiki Kaisha, Tokyo, Japan

[21] Appl. No.: 09/024,981

[22] Filed: Feb. 17, 1998

[30] Foreign Application Priority Data

Aug. 25, 1997 [JP] Japan ................................ 9-227941

[51] Int. Cl.[7] ........................... G06K 5/00; G06K 19/06; H04L 9/00
[52] U.S. Cl. ........................ 235/380; 235/382; 235/492; 713/193
[58] Field of Search .................................. 235/492, 380, 235/382.5, 382; 380/4, 23, 50; 713/193, 159

[56] References Cited

U.S. PATENT DOCUMENTS 4,882,474  11/1989  Anderl et al. ........................... 235/380

FOREIGN PATENT DOCUMENTS 6-295267  10/1994  Japan .

OTHER PUBLICATIONS

Jose Zoreda and Jose Oton, Smart Cards, pp. 5, 6, and 39–45, 1994.

*Primary Examiner*—Donald Hajec
*Assistant Examiner*—Daniel H. Sherr

[57] ABSTRACT

An IC memory card for use with a host information processing has an interface with the host information processor, a common memory having one or more IC memories and a security circuit for prohibiting access to the common memory if address data input from the host processor does not coincide with preset data. The IC memory card may further provide with an attribute memory which stores a security data and attribute information about the IC card wherein the security circuit checks not only the address data but also the data read out from the attribute memory to enhance the security.

14 Claims, 13 Drawing Sheets

1 : IC memory card

1 : IC memory card

42 : Counter

| Input | | | | | Output |
|---|---|---|---|---|---|
| CLK | /R | LO | EP | ET | QA~QD |
| × | L | × | × | × | L |
| ↑ | H | L | × | × | Data preset |
| ↑ | H | H | H | H | Count |
| × | H | H | L | × | Does not count (Data holding) |
| × | H | H | × | L | Does not count (Data holding) |

45 : Decoder IC

Fig.7

| Input | | | | | Output that becomes LOW |
|---|---|---|---|---|---|
| INHIBIT | D1 | D2 | D3 | D4 | |
| L | L | L | L | L | S0 |
| L | H | L | L | L | S1 |
| L | L | H | L | L | S2 |
| L | H | H | L | L | S3 |
| L | L | L | H | L | S4 |
| L | H | L | H | L | S5 |
| L | L | H | H | L | S6 |
| L | H | H | H | L | S7 |
| L | L | L | L | H | S8 |
| L | H | L | L | H | S9 |
| L | L | H | L | H | S10 |
| L | H | H | L | H | S11 |
| L | L | L | H | H | S12 |
| L | H | L | H | H | S13 |
| L | L | H | H | H | S14 |
| L | H | H | H | H | S15 |
| H | X | X | X | X | All outputs become H |

46 : Decoder IC

Fig.11

| CLK | R | D | Q |
|---|---|---|---|
| ↑ | H | H | H |
| ↑ | H | L | L |
| ↓ | H | X | Does not change |
| X | L | X | L |

95 : IC memory card

IC MEMORY CARD WITH SECURITY CHECK

BACKGROUND OF THE INVENTION

1. Field of the Invention

The present invention relates to IC memory cards that comply with PC card standards and are used as external storage media for information processing equipment such as notebook personal computers, portable terminal units, and the like.

2. Description of the Related Art

FIG. 16 is a block diagram illustrating an example of prior IC memory cards. Referring to FIG. 16, an IC memory card 200 comprises an interface section 202 that complies with PC card standards and interfaces with a host system apparatus 201, a common memory section 203 that stores data from host system apparatus 201 and consists of SRAM or flash memory or the like, an attribute memory section 204 that stores attribute information about IC memory card 200, and a power-supply control circuit 205 that provides to each section of IC memory card 200 externally input source power and also generates and outputs a reset signal.

Interface section 202 is composed of an address bus buffer 207, an address decoder 208, a card mode controller 209, and a data bus buffer 210. The connection between IC memory card 200 and host system apparatus 201 is, for example, made by a plug-and-socket connector that is formed of male and female connector members, so that interface section 202 usually contains the female connector member. However, the connectors are omitted from FIG. 16.

Address bus buffer 207 and address decoder 208 are connected to the host system apparatus 201 through an address bus 211; card mode controller 209 is connected to the host system apparatus 201 through a control bus 212; and data bus buffer 210 is connected to the host system apparatus 201 through a data bus 213. Power-supply control circuit 205 is connected to the host system apparatus 201. Power-supply control circuit 205 is connected to address bus buffer 207, card mode controller 209, and data bus buffer 210 through a reset signal line, onto which a reset signal /RES is output. Power-supply control circuit 205 is also connected to each section through a power line, onto which a source voltage Vcc is output. However, these connections are omitted from FIG. 16.

Further, address bus buffer 207 is connected to common memory section 203 through an internal address bus 214. Card mode controller 209 is connected to common memory section 203, attribute memory section 204, and data bus buffer 210 through a plurality of signal lines 215. Data bus buffer 210 is connected to common memory section 203 and attribute memory section 204 through an internal data bus 216. Address decoder 208 is connected to card mode controller 209.

In this construction, power-supply control circuit 205 provides to each section the source power input through interface section 202 from host system apparatus 201. Power-supply control circuit 205 genrates a reset signal /RES to output to address bus buffer 207, card mode controller 209, and data bus buffer 210, when the source power input from host system apparatus 201 rises to HIGH level and falls to LOW level.

Address bus buffer 207 receives address data from host system apparatus 201 through address bus 211 and outputs the input address data into common memory section 203 and attribute memory section 204 through internal address bus 214. Further, address decoder 208 receives the address data from host system apparatus 201 and decodes the address data to output a control signal into card mode controller 209 and outputs a chip select signal into common memory section 203 and attribute memory section 204.

In addition to the control signal from address decoder 208, card mode controller 209 is also provided with a card-mode control signal comprising an output enable signal, a write enable signal, a card enable signal, and a memory-space select signal and the like through control bus 212. Here, the memory-space select signal selects one of the memory spaces of common memory section 203 and attribute memory section 204. Card mode controller 209 then generates from these signals a memory control signal, which consists of an output enable signal, a write enable signal, a chip select signal, and the like, for controlling common memory section 203 and attribute memory 204, and also generates an I/O control signal. Card mode controller 209 then outputs the memory control signal into common memory section 203 and attribute memory section 204 through signal lines 215 and outputs the I/O control signal into data bus buffer 210.

Data bus buffer 210 performs I/O control, on data bus 213 and internal data bus 216, of data between host system apparatus 201 and common memory section 203 and of data between host system apparatus 201 and attribute memory section 204, based on the I/O control signal input from card mode controller 209. Further, common memory section 203 and attribute memory 204 perform the writing and reading of data through internal data bus 216, based on the address data input through internal address bus 214 and the memory control signal input through signal lines 215.

The IC memory card described above can be used with host system apparatus produced by a plurality of manufacturers, as far as they are compatible with the architecture of the IC memory card. Also, those who have access to the memory content of the IC memory card are not limited to the users of a particular host system apparatus. Therefore, as long as the host system apparatus runs on the same operating system, any one who has a knowledge of the operating system can freely read data out from common memory section 203 and write data into common memory section 203, when the IC memory card is used as an external storage medium. That means there has been a problem of being unable to maintain security of the data stored in common memory section 203.

SUMMARY OF THE INVENTION

The present invention has been therefore devised to solve the above problem. An essential object of the present invention is to obtain IC memory cards that have a function of enhancing the security of data stored in their memory by preventing the easy reading of data from memory and the easy writing of data into memory.

According to one embodiment of the present invention, an IC memory card comprises an interface section that interfaces with a host system apparatus, a common memory section that is formed of at least one IC memory and stores data, and a security circuit section that prohibits and permits access to the common memory section. The security circuit section prohibits access to the common memory section, if address data input from the host system apparatus in a predetermined number of cycles through the interface section does not agree with preset data. The security circuit section permits access to the common memory section, if address data input from the host system apparatus in a predetermined number of cycles through the interface section agrees with the preset data. In other words, if a signal having a predetermined pattern is not output during a predetermined number of cycles, then access to the common memory section is impossible. Therefore, the reading of data from memory or the writing of data into memory is not easily done, so that the security of data stored in the memory is enhanced.

Preferably, the above security circuit section has a data generating circuit that generates predetermined data in each cycle, a comparison circuit that compares in each cycle the data generated by the data generating circuit with the address data input from the host system apparatus to output the comparison result, and a judgment circuit that judges, based on the comparison results output from the comparison circuit, whether the processing of prohibiting access to the common memory section should be performed or not, to prohibit and permit access to the common memory section, depending on the judgment.

If the above data generating circuit is formed of a binary counter that counts based on a predetermined signal input from the host system apparatus, then the security circuit can be composed of logic circuits. Therefore, the security function can be implemented with simple circuitry.

Further, the above comparison circuit can be composed of a first decoder that decodes the data generated by the data generating circuit, a second decoder that decodes the address data input from the host system apparatus, and a comparison section that compares in each cycle the data decoded by the first decoder with the data decoded by the second decoder to output the comparison result. In this case, the combination of the comparisons performed in the cycles for the data generated by the data generating circuit and the data input from the host system apparatus can be changed by the comparison section.

According to another embodiment of the present invention, an IC memory card comprises an interface section that interfaces with a host system apparatus, a common memory section that is formed of at least one IC memory and stores data, an attribute memory section that has a security-data storage area for storing predetermined security data and stores attribute information about the card, and a security circuit section that prohibits and permits access to the common memory section. The security circuit section checks the address data input from the host system apparatus and also checks the data read out from the attribute memory based on the checked address data. The security circuit section then permits access to the common memory section, if the checked address data agrees with the address data that indicates the location of the security-data storage area and if the read data agrees with the security data. The security circuit section prohibits access to the common memory section, if the checked address data does not agree with the address data that indicates the location of the security-data storage area or if the read data does not agree with the security data.

In this construction, in order to access the common memory section, it is necessary that not only does the data read out from the attribute memory section by the host system apparatus agree with predetermined security data, but also the address data input from the host system apparatus agrees with predetermined address data about the security-data storage area. Therefore, the reading of data from memory and the writing of data into memory are not easily done, so that the security of data stored in the memory is enhanced.

In this case, the security circuit section may be constructed so that access to the common memory section should be prohibited, unless a control signal for the reading of data from the attribute memory section is input from the host system apparatus, when the address data is checked. The security of data stored in the memory is further enhanced by this means.

Further, the above security circuit section may have an address-data setting section that sets predetermined address data indicating the location of the security-data storage area, an address-data comparison section that compares the address data input from the host system apparatus with the predetermined address data set in the address-data setting section to output the comparison results, a data setting section that sets predetermined security data, a data comparison section that compares the data read out from the attribute memory section based on the address data input from the host system apparatus with the predetermined security data set in the data setting section to output the comparison results, a judgment circuit that judges whether to prohibit access to the common memory section or not, depending on the comparison results output from the address-data comparison section and the data comparison section, to prohibit and permit access to the common memory section, depending on the judgment.

Further, the above judgment circuit may be constructed so that access to the common memory section should be prohibited, unless a control signal for the reading of data from the attribute memory section is input from the host system apparatus, when the comparison results are input from the address-data comparison section.

In any of these cases, the checking of the address data about the common memory section input from the host system apparatus can be prohibited, so that the reading of data from memory or the writing of data into memory is not easily done. Therefore, the security of data stored in memory can be enhanced.

BRIEF DESCRIPTION OF THE DRAWINGS

These and other objects and features of the present invention will become clear from the following description taken in conjunction with the preferred embodiments thereof and the accompanying drawings throughout which like parts are designated by like reference numerals, and in which:

FIG. 7 illustrates the truth table of the decoder IC 45 in FIG. 6;

FIG. 11 illustrates the truth table of the D flip-flops 71 to 86 in FIG. 10;

DETAILED DESCRIPTION OF THE PREFERRED EMBODIMENTS

The preferred embodiments according to the present invention will be described below in conjunction with the attached drawings. In the following description, the symbol / put in front of symbols which denote various signals indicates the inversion of the signal level, hereby showing that the signals are active-low.

FIRST EMBODIMENT

Figure 1:
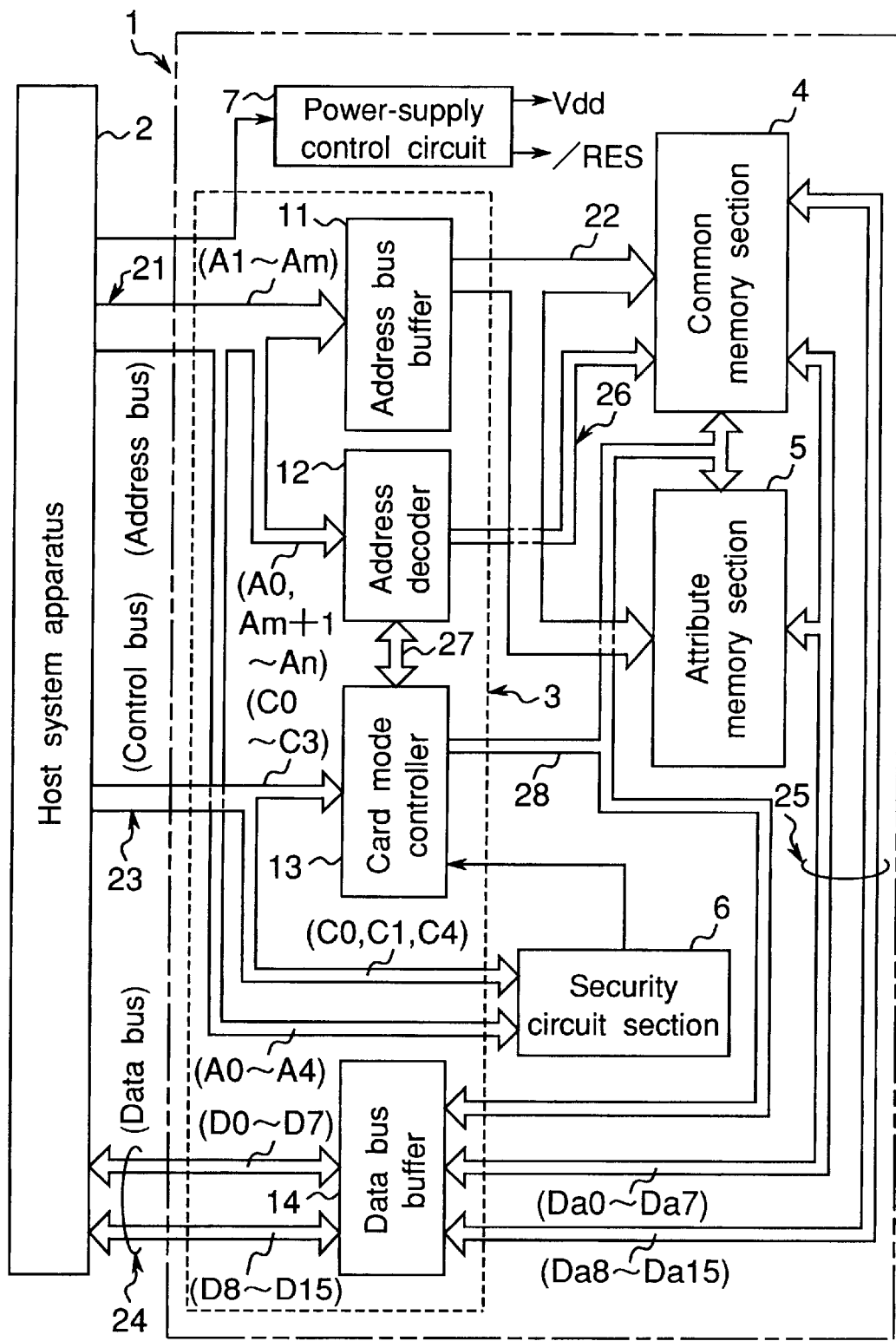
FIG. 1 is a block circuit diagram illustrating an IC memory card in a first embodiment of the present invention.

Referring to FIG. 1, an IC memory card 1 comprises an interface section 3 that complies with PC card standards and interfaces with a host system apparatus 2 having information processing equipment, a common memory section 4 that stores data from host system apparatus 2 and includes IC memory such as SRAM and flash memory and the like, an attribute memory section 5 that stores attribute information about IC memory card 1 and includes IC memory of EEPROM, a security circuit section 6 that prohibits access to common memory section 4 by host system apparatus 2 unless a predetermined procedure is executed, and a power-supply control circuit 7 that provides to each section of IC memory card 1 the source power input from the outside and also generates and outputs a reset signal /RES.

Interface section 3 is formed of an address bus buffer 11, an address decoder 12, a card mode controller 13, and a data bus buffer 14. The connection between IC memory card 1 and host system apparatus 2 is, for example, made by a plug-and-socket connector that is formed of male and female connector members, so that interface section 3 usually contains the female connector member. However, the connectors are omitted from FIG. 1.

Further, address bus buffer 11 is connected to the host system apparatus 2 through address signal lines A1 to Am, where m is a natural number. An address data word Ad1 to Adm is input through address signal lines A1 to Am. Address decoder 12 is connected to the host system apparatus 2 through address signal lines A0 and Ar+1 to An, where n is a natural number such that n>m. An address data bit Ad0 and an address data word Adm+1 to Adn are input through address signal lines A0 and Am+1 to An.

Address signal lines A0 to An form an address bus 21. Ad0 is the least significant bit and Adn is the greatest significant bit of the address data word Ad0 to Adn. Address bus buffer 11 is connected to common memory section 4 and attribute memory section 5 through internal address bus 22. The address data word Ad1 to Adm input from address bus 21 is input to common memory section 4 and attribute memory section 5 through internal address bus 22.

Card mode controller 13 is connected to the host system apparatus 2 through control signal lines C0 to C3. A card enable signal /CE1 is input through control signal line C0; a card enable signal /CE2 is input through control signal line C1; a write enable signal /WE is input through control signal line C2; and an output enable signal /OE is input through control signal line C3. Security circuit section 6 is connected to card mode controller 13 and connected to the host system apparatus 2 through control signal lines C0, C1, C4 and predetermined address signal lines, for example, address signal lines A0 to A4. A memory-space select signal /REG that selects one of the common memory section 4 and attribute memory section 5 for memory space is input to security circuit section 6 through control signal line C4. Control signal lines C0 to C4 form a control bus 23.

Data bus buffer 14 is connected to the host system apparatus 2 through a data bus 24 formed of data lines D0 to D15. Data bus buffer 14 performs the input and output of a data word Dd0 to Dd15 through data lines D0 to D15. Further, data bus buffer 14 is connected to common memory section 4 through internal data lines Da0 to Da15 and is connected to attribute memory section 5 through internal data lines Da0 to Da7. Common memory section 4 performs the input and output of the data word Dd0 to Dd15 through internal data lines Da0 to Da15. Attribute memory section 5 performs the input and output of the data word Dd0 to Dd7 through data lines Da0 to Da7. Internal data lines Da0 to Da15 form internal data bus 25. Data lines D0 to D15 are respectively associated with internal data lines Da0 to Da15.

Further, address decoder 12 is connected to common memory section 4 and attribute memory section 5 through internal control signal lines 26 and is connected to card mode controller 13 through an internal control signal line 27. Card mode controller 13 is connected to common memory section 4, attribute memory section 5, and data bus buffer 14 through internal control signal lines 28.

Power-supply control circuit 7 is connected to the host system apparatus 2, receiving power from host system apparatus 2, and provides to each section of IC memory card 1 the source voltage Vdd. However, the connections are omitted from FIG. 1. Also, power-supply control circuit 7 is connected to security circuit section 6, address buffer 11, address decoder 12, card mode controller 13, and data bus buffer 14 to transmit a reset signal /RES. However, these connections are also omitted from FIG. 1. Power-supply control circuit 7 generates the reset signal /RES to output into security circuit section 6, address bus buffer 11, address decoder 12, card mode controller 13, and data bus buffer 14, when the source power input from host system apparatus 2 rises to HIGH level and falls to LOW level.

In the above construction, address decoder 12 generates a chip select signal /CS for selecting an IC memory in common memory section 4 and attribute memory section 5, from the address data word Adm+1 to Adn input through address signal lines Am+1 to An. Address decoder 12 then outputs the chip select signal /CS into common memory section 4 and attribute memory section 5 through internal control signal line 26.

The least significant bit Ad0 in the address data word Ad0 to Adn expresses a choice of whether the internal data lines Da0 to Da7 should be used or the internal data lines Da8 to Da15 should be used. For example, if Ad0 is at LOW level, then address decoder 12 outputs a signal that selects internal data lines Da0 to Da7 into card mode controller 13 through internal control line 27; if Ad0 is at HIGH level, then address decoder 12 outputs a signal that selects internal data lines Da8 to Da15 into card mode controller 13 through internal control line 27. The address data word Ad1 to Adm input to address bus buffer 11 is input to common memory section 4 and attribute memory section 5 through internal address bus 22.

If card enable signals /CE1 and /CE2 are both at LOW level, then card mode controller 13 ignores the select signal input from address decoder 12 and controls the data bus buffer 14 so that all the data lines of data bus 24 and internal data bus 25 should be used. If card enable signal /CE1 is at LOW level, and if card enable signal /CE2 is at HIGH level, then card mode controller 13 uses data lines D0 to D7 of data bus 24 and controls the data bus buffer 14 so that either internal data lines Da0 to Da7 should be used or data lines Da8 to Da15 should be used, depending on the select signal from address decoder 12.

Further, if card enable signal /CE1 is at HIGH level, and if card enable signal /CE2 is at LOW level, then card mode controller 13 ignores the select signal input from address decoder 12, uses data lines D8 to D15, and controls data bus buffer 14 so that internal data lines Da8 to Da 15 should be used. If at least one of the card enable signals /CE1 and /CE2 is at lOW level, then card mode controller 13 outputs a signal that enables address decoder 12 into internal control signal line 27. If card enable signals /CE1 and /CE2 are both at HIGH level, then card mode controller 13 does not output a signal that enables address decoder 12, so that IC memory card 1 becomes a state of standing by.

Card mode controller 13 outputs the write enable signal /WE and the output enable signal /OE into common memory section 4, attribute memory section 5, and data bus buffer through internal control signal lines 28, depending on the write enable signal /WE input from control signal line C2 and the output enable signal /OE input from control signal line C3. Card mode controller 13 also outputs a signal that gives instructions on which one of common memory section 4 and attribute memory section to select for memory space, into address decoder 12 through internal control signal line 27, depending on the output level of security circuit section 6. Address decoder 12 generates the chip select signal /CS, following the instruction signal on memory space input from card mode controller 13, to output into common memory section 4 and attribute memory section 5 through internal control signal lines 26.

Security circuit section 6 detects the signal level in each cycle of each address data bit of the address data word Ad1 to Ad4 that is input during a predetermined number of cycles, to check whether the signal level agrees with a corresponding signal level of preset signal levels. If all the checked signal levels agree with the corresponding preset signal levels, then security circuit section 6 outputs the memory-space select signal /REG, which has been input from host system apparatus 2 through control signal line C4, into card mode controller 13. If at least one of the checked signal levels does not agree with the corresponding preset signal level, then security circuit section 6 outputs a signal that selects attribute memory section 5 into card mode controller 13, regardless of the memory-space select signal /REG input from host system apparatus 2 through control signal line C4.

In the following description, it is assumed that host system apparatus 2 outputs HIGH level of the memory-space select signal /REG, when selecting common memory section 4; and host system apparatus 2 outputs LOW level of the memory-space select signal /REG, when selecting common memory section 4.

Figure 2:
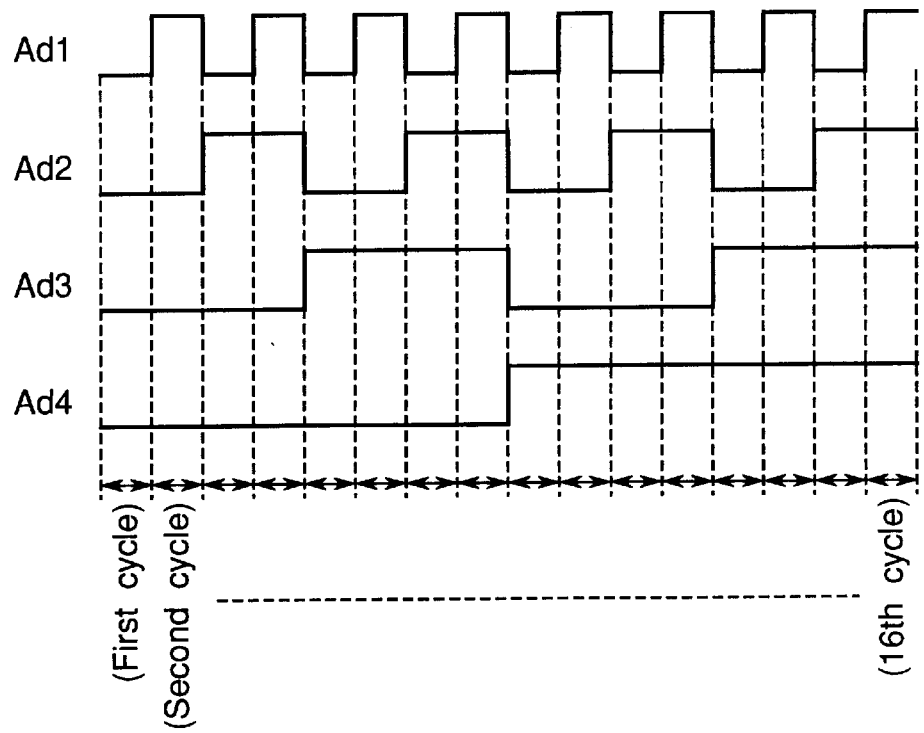
FIG. 2 is a timing chart illustrating a predetermined pattern of the address data word Ad1 to Ad4.

FIG. 2 is a timing chart of a predetermined pattern of the address data word Ad1 to Ad4. If the address data word Ad1 to Ad4 input from host system apparatus 2 varies during 16 cycles as shown in FIG. 2, security circuit section 6 outputs the memory-space select signal /REG, which has been input from host system apparatus 2 through control signal line C4, into card mode controller 13. If the address data word Ad1 to Ad4 input from host system apparatus 2 does not vary as shown in FIG. 2 during the 16 cycles, then security circuit section 6 outputs a LOW level signal that selects attribute memory section 5 into card mode controller 13, regardless of the memory-space select signal /REG input from host system apparatus 2 through control signal line C4.

Card mode controller 13 outputs into address decoder 12 a signal that gives instructions for selecting common memory section 4, if receiving a HIGH level signal from security circuit section 6. Card mode controller 13 outputs into address decoder 12 a signal that gives instructions for selecting attribute memory section 5, if receiving a LOW level signal from security circuit section 6. Therefore, when a LOW level signal is output from security circuit section 6, attribute memory section 5 is automatically selected, so that access to common memory section 4 becomes impossible.

In other words, if address data of a predetermined pattern is input, for example, if the signal levels of the address data word Ad1 to Ad4 varying in a predetermined pattern during a predetermined number of cycles are input, then security circuit section 6 permits access to common memory section 4. If the signal levels of the address data word Ad1 to Ad4 varying in a pattern different from the predetermined pattern are input, then security circuit section 6 prohibits access to common memory section 4. In this way, access to common memory section 4 by unspecified systems or by unspecified operators can be made impossible.

Figure 3:
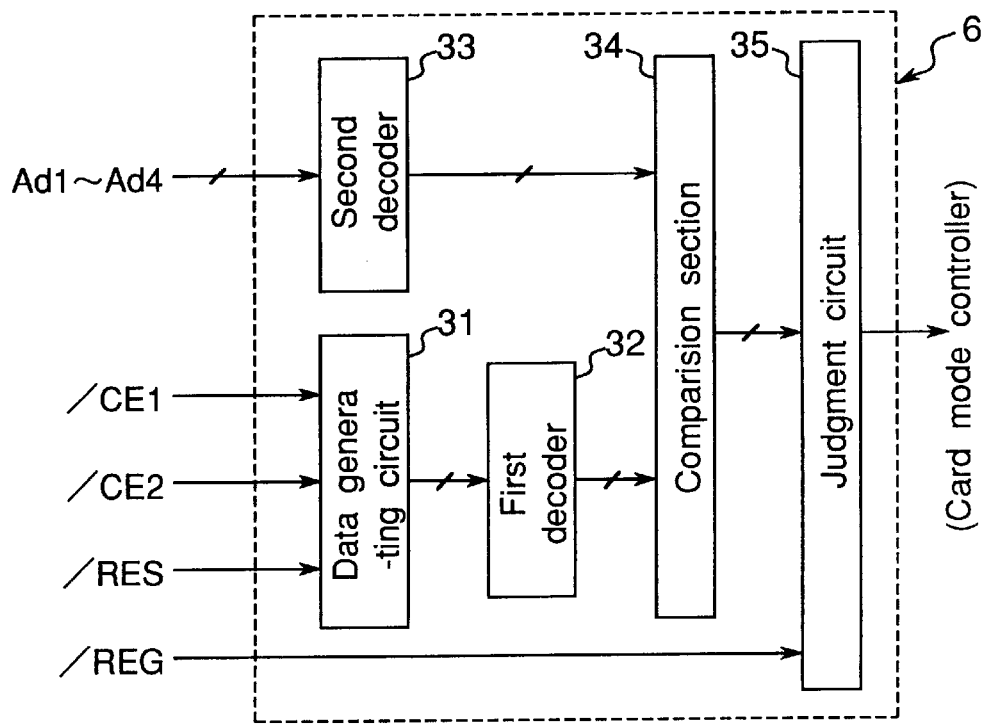
FIG. 3 is a block circuit diagram illustrating the security circuit section 6 in FIG. 1.

FIG. 3 is a block circuit diagram illustrating an example of the security circuit section 6 in FIG. 1. The operation of security circuit section 6 is described in the following with reference to FIG. 3. In FIG. 3, it is assumed that the predetermined number of cycles is 16, and the address data word Ad1 to Ad4 is used. Referring to FIG. 3, security circuit section 6 has a data generating circuit 31 that generates a 4-bit data word QdA to QdD in each of the 16 cycles, where the data word QdA to QdD varies with the cycles, a first decoder 32 that converts each 4-bit data word QdA to QdD generated by data generating circuit 31 into a hexadecimal number, and a second decoder 33 that converts each address data word Ad1 to Ad4 input from host system apparatus 2 into a hexadecimal number.

Further, security circuit section 6 has a comparison section 34 that compares each 16-bit data word output from first decoder 32 with a corresponding 16-bit data word output from second decoder 33 and a judgment circuit 35 that judges whether the 16-bit data word output from first decoder 32 is the same as the corresponding 16-bit data word output from second decoder 33, based on the comparison results output from comparison section 34. First decoder 32, second decoder 33, and comparison section 34 form a comparison circuit section.

Data generating circuit 31 is connected to the host system apparatus 2 through control signal lines C0, C1. Data generating circuit 31 generates the 4-bit data word QdA to QdD, in each of the 16 cycles, from the card enable signals /CE1 and /CE2 input from control signal lines C0, C1 to output the 4-bit data word into first decoder 32. Data generating circuit 31 is also connected to power-supply control circuit 7 and receives the reset signal /RES. Second decoder 33 is connected to the host system apparatus 2 through address signal lines A1 to A4 and receives address data Ad1 to Ad4 from the address signal lines A1 to A4. First decoder 32 and second decoder 33 are connected to comparison section 34. Comparison section 34 is connected to judgment circuit 35. Judgment circuit 35 is connected to card mode controller 13.

The 4-bit data word QdA to QdD output from data generating circuit 31 is input to first decoder 32 and output into comparison section 34 after being decoded into a 16-bit data word Sd0 to Sd15. Here, each 4-bit data word represents one of the predetermined 16 different elements of data. First decoder 32 uniquely associates one of the 16 bits of the data word Sd0 to Sd15 with each of the 16 4-bit data words QdA to QdD. First decoder 32 then sets only the uniquely associated bit of the data word Sd0 to Sd15 at LOW level to output into comparison section 34.

Similarly, second decoder 33 uniquely associates one of the 16 bits of the data word Sda0 to Sda15 with each of the 16 4-bit data words Ad1 to Ad4. Second decoder 33 then sets only the uniquely associated bit of the data word Sda0 to Sda15 at LOW level to output into comparison section 34. Comparison section 34 compares in each cycle the 16-bit data word Sd0 to Sd15 with the 16-bit data word Sda0 to Sda15 to output the comparison result into judgment circuit 35.

Judgment circuit 35 outputs the memory-space select signal /REG, which has been input from host system apparatus 2, into card mode controller 13, if the address data word Ad1 to Ad4 input from host system apparatus 2 is the same as the 4-bit data word QdA to QdD in every cycle of the 16 cycles. If the address data word Ad1 to Ad4 input from host system apparatus 2 is different from the 4-bit data word QdA to QdD in at least one of the 16 cycles, then judgment circuit 35 outputs a signal that selects attribute memory section 5 into card mode controller 13, regardless of the memory-space select signal /REG input from host system apparatus 2. In this way, by controlling the signal level of the memory-space select signal /REG to be input to card mode controller 13, judgment circuit 35 makes it impossible for unspecified systems or unspecified operators to access common memory section 4.

Figures 4, 5:
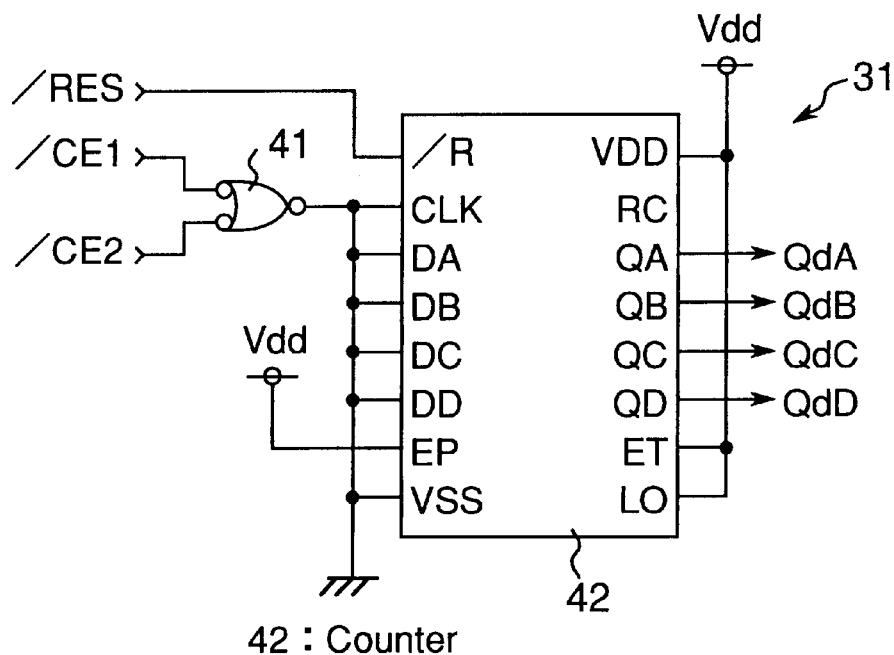
FIG. 4 is a circuit diagram illustrating the data generating circuit 31 in FIG. 3.
FIG. 5 illustrates the truth table of the counter 42 in FIG. 3.

FIG. 4 is a circuit diagram illustrating the data generating circuit 31. Data generating circuit 31 is composed of an AND circuit 41 and a synchronous 4-bit binary counter 42, called counter hereafter, that uses, for example, the MOS standard logic IC 74HC161. One input of AND circuit 41 is connected to control signal line C0 and receives the card enable signal /CE1 from host system apparatus 2. The other input is connected to control signal line C1 and receives the card enable signal /CE2 from host system apparatus 2.

The output of AND circuit 41 is applied to the clock input CLK of counter 42. The reset input /R of counter 42 is connected to power-supply control circuit 7 and receives the reset signal /RES. The inputs DA, DB, DC, DD of counter 42 are grounded. The ET (ENABLE T), EP (ENABLE P), and LO (LOAD) inputs are applied to the source voltage Vdd.

FIG. 5 illustrates the truth table of 74HC161 that forms counter 42. The ET, EP, and LO inputs are applied to the source voltage Vdd. Therefore, if the reset signal /RES is at HIGH level, then counter 42 counts whenever the card enable signals /CE1 and /CE2 are both at HIGH level, that is, the clock input CLK rises to HIGH level. If the reset signal /RES is at LOW level, then counter 42 is reset, so that the outputs QA to QD all become LOW level, and counter 42 returns to the initial state.

Figure 6:
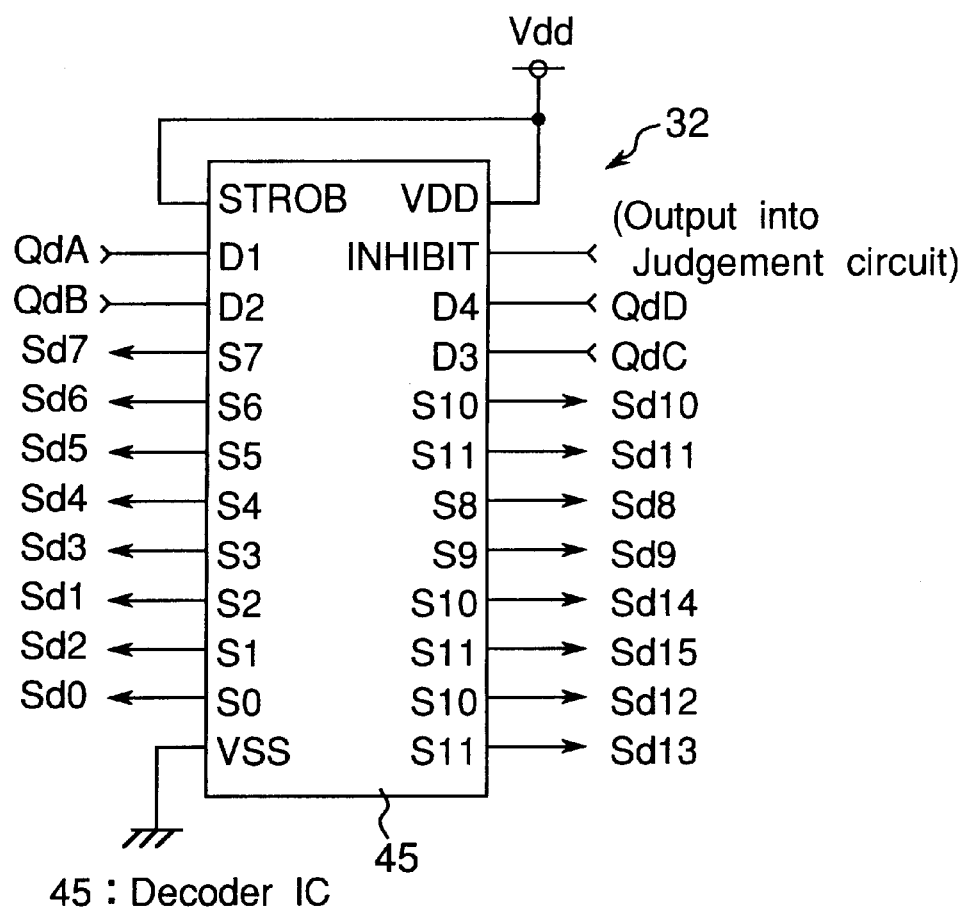
FIG. 6 is a circuit diagram illustrating the first decoder 32 in FIG. 3.

FIG. 6 is a circuit diagram illustrating the first decoder 32. First decoder 32 is formed of 4–16 line decoder 45, called decoder IC hereafter, that uses, for example, the C-MOS standard logic IC 4515B. Referring to FIG. 6, in decoder IC 45, the output QA of counter 42 is applied to the data input D1; the output QB of counter 42 is applied to the data input D2; the output QC of counter 42 is applied to the data input D3; and the output QD of counter 42 is applied to the data input D4. Also, in decoder IC 45, the INHIBIT input is applied to the output of judgment circuit 35, and the STROB input is applied to the source voltage Vdd. Decoder IC 45 outputs the 16-bit data word Sd0 to Sd15 through the data outputs S0 to S15, depending on the data word input to the data inputs D1 to D4.

FIG. 7 illustrates the truth table of 4515B that forms decoder IC 45. Referring to FIG. 7, if the INHIBIT input is at LOW level in decoder IC 45, then only one of the outputs S0 to S15 becomes LOW level, corresponding to the data word input through the data inputs D1 to D4. If the INHIBIT input is at HIGH level, then the outputs S0 to S15 become all HIGH level, regardless of the data word input through the data inputs D1 to D4.

Figure 8:
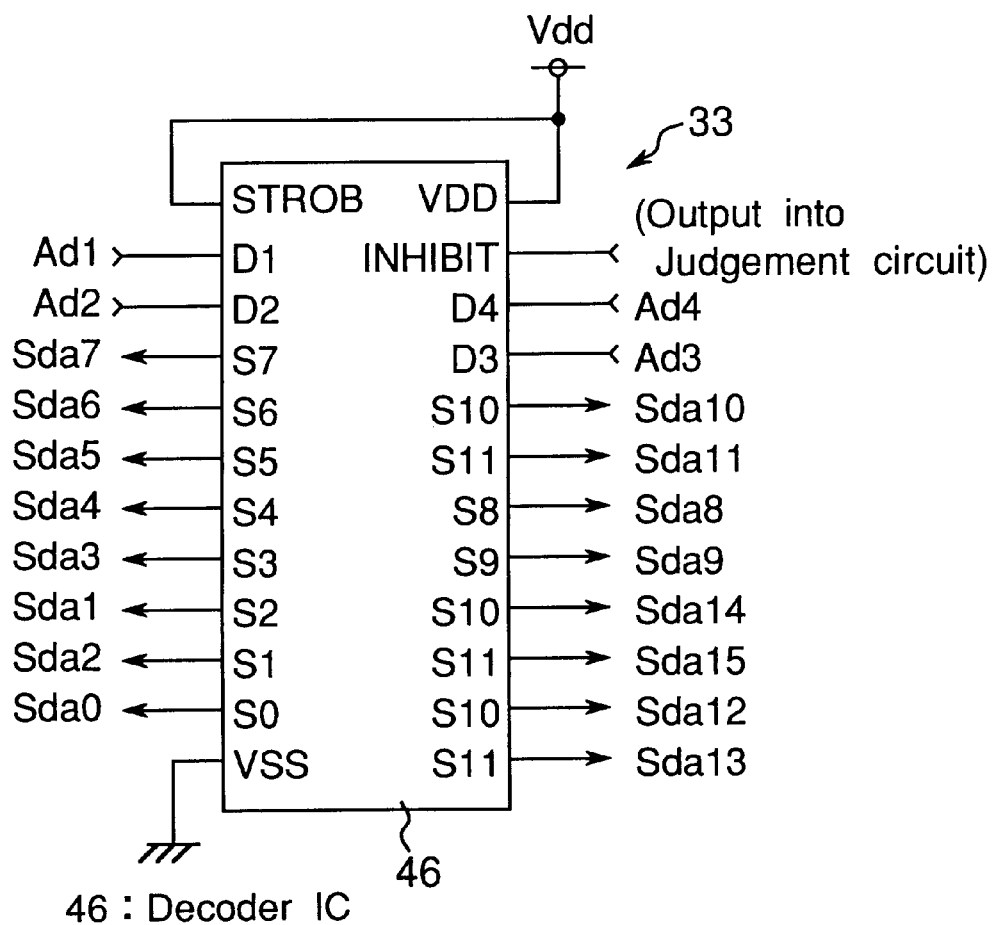
FIG. 8 is a circuit diagram illustrating the second decoder 33 in FIG. 3.

FIG. 8 is a circuit diagram illustrating the second decoder 33. Similarly as first decoder 32, second decoder 33 is formed of 4–16 line decoder 46 that uses, for example, the C-MOS standard logic IC 4515B. Referring to FIG. 8, in decoder IC 46, the address signal line A1 is applied to the data input D1; the address signal line A2 is applied to the data input D2; the address signal line A3 is applied to the data input D3; and the address signal line A4 is applied to the data input D4. Also, in decoder IC 46, the INHIBIT input is applied to the output of judgment circuit 35, and the STROB input is applied to the source voltage Vdd. Decoder IC 46 outputs the 16-bit data word Sda0 to Sda15 through the data outputs S0 to S15, depending on the data word input to the data inputs D1 to D4. A figure illustrating the truth table of 4515B that forms decoder IC 46 is the same as FIG. 7 and omitted from here.

Figure 9:
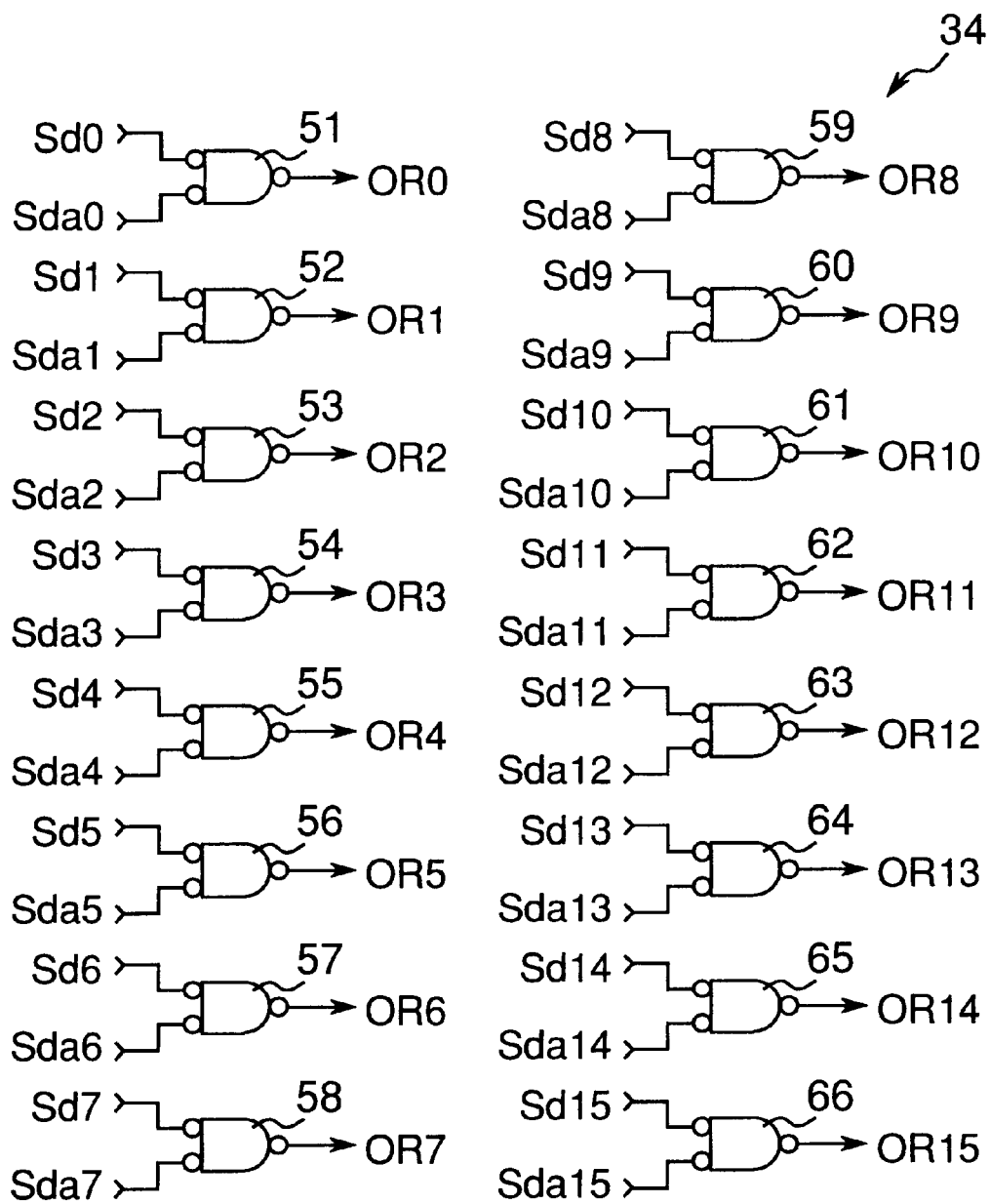
FIG. 9 is a circuit diagram illustrating the comparison section 34 in FIG. 3.

FIG. 9 is a circuit diagram illustrating comparison section 34. Referring to FIG. 9, comparison circuit 34 is formed of 16 OR circuits 51 to 66. One input of each OR circuit 51 to 66 is uniquely applied to one of the outputs S0 to S15 of decoder 45. The other input of each OR circuit 51 to 66 is applied to a corresponding one of the outputs S0 to S15 of decoder 46. Here, the outputs S0 of decoders 45 and 46 are applied to OR circuit 51; the outputs S1 of decoders 45 and 46 are applied to OR circuit 52; and so forth. The output of each OR circuit 51 to 66 is connected to judgment circuit 35.

In this way, OR circuit 51 receives data bit Sd0 through its one input and data bit Sda0 through its other input; OR circuit 52 receives data bit Sd1 through its one input and data bit Sda1 through its other input; and so forth. Therefore, each OR circuits 51 to 66 receives a corresponding data bit of Sd0 to Sd15 through its one input and receives a corresponding data bit of Sda0 to Sd15 through its other input.

The output of each OR circuit 51 to 66 becomes LOW level if and only if both its inputs are LOW level. If the combination of the connections of the data outputs S0 to S15 of decoder IC 45 applied to the inputs of OR circuits 51 to 56 or the combination of the connections of the data outputs S0 to S15 of decoder IC 46 applied to the inputs of OR circuits 51 to 56 is changed, then the address data word Ad1 to Ad4 varying during the 16 cycles can be checked in a different order against the data word QdA to QdD output from counter 42 in the 16 cycles.

Figure 10:
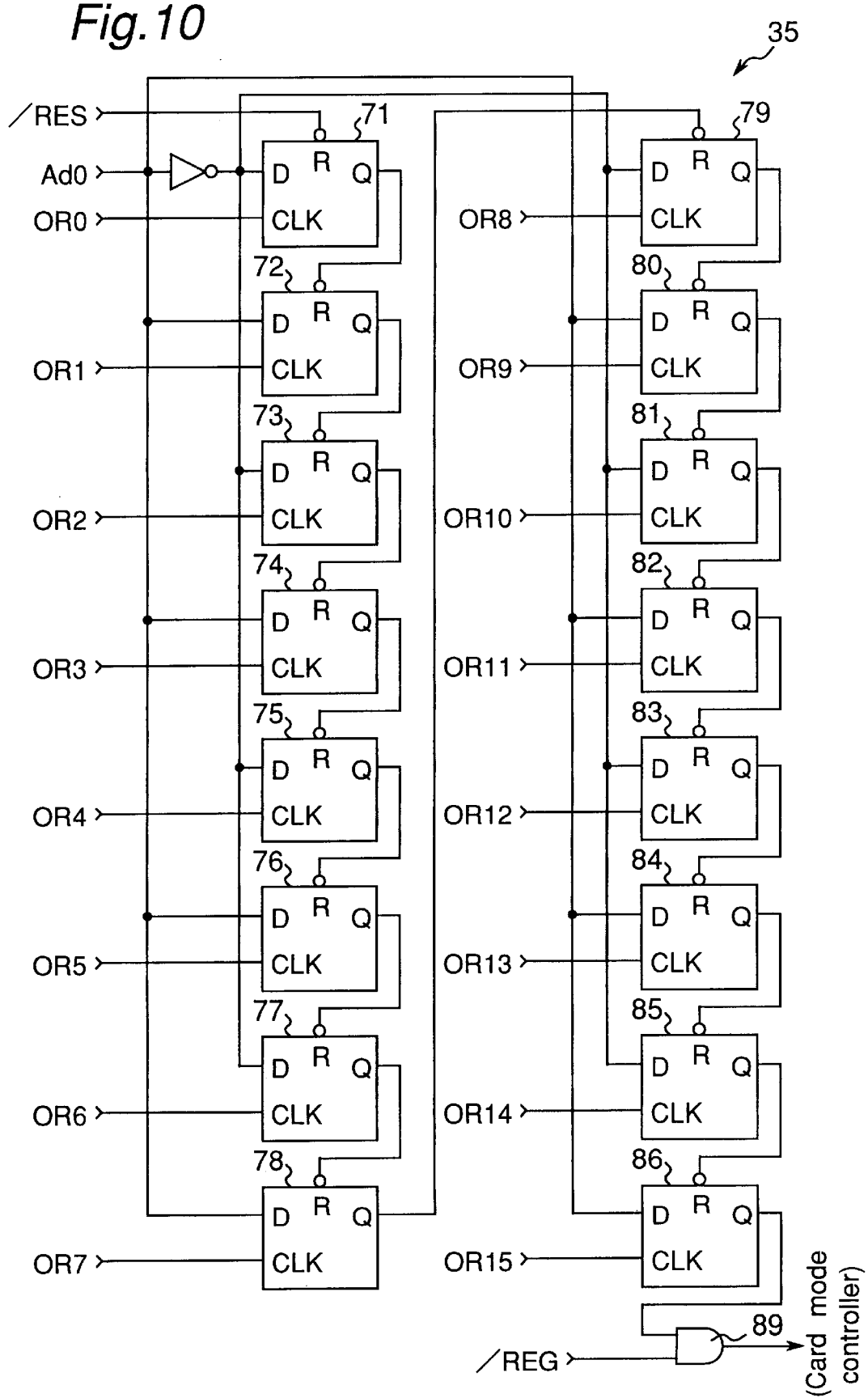
FIG. 10 is a circuit diagram illustrating the judgment circuit 35 in FIG. 3.

FIG. 10 is a circuit diagram illustrating the judgment circuit 35. In FIG. 10, the outputs of OR circuits 51 to 66 are respectively denoted by OR0 to OR15. Referring to FIG. 10, judgment circuit 35 is composed of 16 D flip-flops 71 to 86, an inverter circuit 88, and an AND circuit 89. The input of inverter circuit 88 is applied to address signal line A0. The output of inverter circuit 88 is applied to each D input of the D flip-flops 71, 73, 75, 77, 79, 81, 83, and 85. Each D input of the D flip-flops 72, 74, 76, 78, 80, 82, and 84 is applied to address signal line A0. In D flip-flop 71, the clock input CLK is applied to the output of OR circuit 51; the reset input R is connected to power-supply control circuit 7 and receives the reset signal /RES; and the Q output is applied to the reset input R of D flip-flop 72.

In D flip-flop 72, the clock input CLK is applied to the output of OR circuit 52, and the Q output is applied to the reset input R of D flip-flop 73. In D flip-flop 73, the clock input CLK is applied to the output of OR circuit 53, and the Q output is applied to the reset input R of D flip-flop 74. In D flip-flop 74, the clock input CLK is applied to the output of OR circuit 54, and the Q output is applied to the reset input R of D flip-flop 75. In D flip-flop 75, the clock input CLK is applied to the output of OR circuit 55, and the Q output is applied to the reset input R of D flip-flop 76.

In D flip-flop 76, the clock input CLK is applied to the output of OR circuit 56, and the Q output is applied to the reset input R of D flip-flop 77. In D flip-flop 77, the clock input CLK is applied to the output of OR circuit 57, and the Q output is applied to the reset input R of D flip-flop 78. In D flip-flop 78, the clock input CLK is applied to the output of OR circuit 58, and the Q output is applied to the reset input R of D flip-flop 79. In D flip-flop 79, the clock input CLK is applied to the output of OR circuit 59, and the Q output is applied to the reset input R of D flip-flop 80.

Further, in D flip-flop 80, the clock input CLK is applied to the output of OR circuit 60, and the Q output is applied to the reset input R of D flip-flop 81. In D flip-flop 81, the clock input CLK is applied to the output of OR circuit 61, and the Q output is applied to the reset input R of D flip-flop 82. In D flip-flop 82, the clock input CLK is applied to the output of OR circuit 62, and the Q output is applied to the reset input R of D flip-flop 83. In D flip-flop 83, the clock input CLK is applied to the output of OR circuit 63, and the Q output is applied to the reset input R of D flip-flop 84.

In D flip-flop 84, the clock input CLK is applied to the output of OR circuit 64, and the Q output is applied to the reset input R of D flip-flop 85. In D flip-flop 85, the clock input CLK is applied to the output of OR circuit 65, and the Q output is applied to the reset input R of D flip-flop 86. In D flip-flop 86, the clock input CLK is applied to the output of OR circuit 66, and the Q output is applied to one input of AND circuit 89. The other input of AND circuit 89 is connected to the host system apparatus 2 through control signal line C4 and receives the memory-space select signal /REG. The output of AND circuit 89 forms the output of judgment circuit 35, that is, the output of security circuit section 6, and connected to card mode controller 13.

Figure 11:
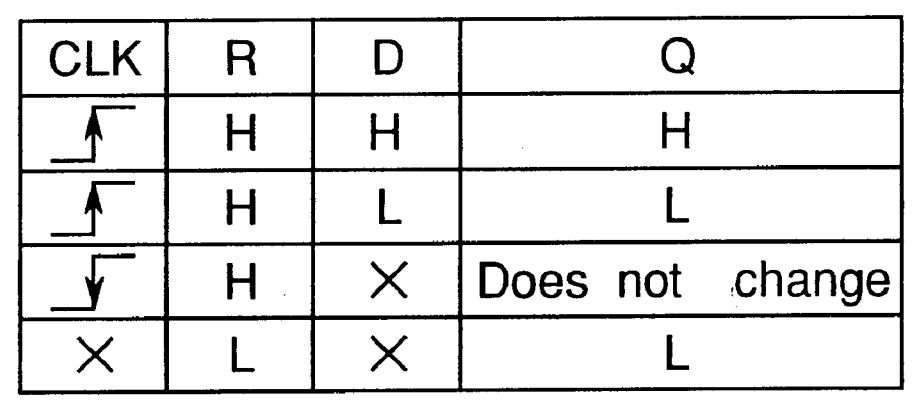

FIG. 11 illustrates the truth table of D flip-flops 71 to 86. As shown in FIG. 11, the Q output of each D flip-flop 71 to 86 memorizes and continues to output the state at the D input at a positive edge of the signal input to the clock input CLK until the next positive edge of the signal input to CLK.

Figure 12:
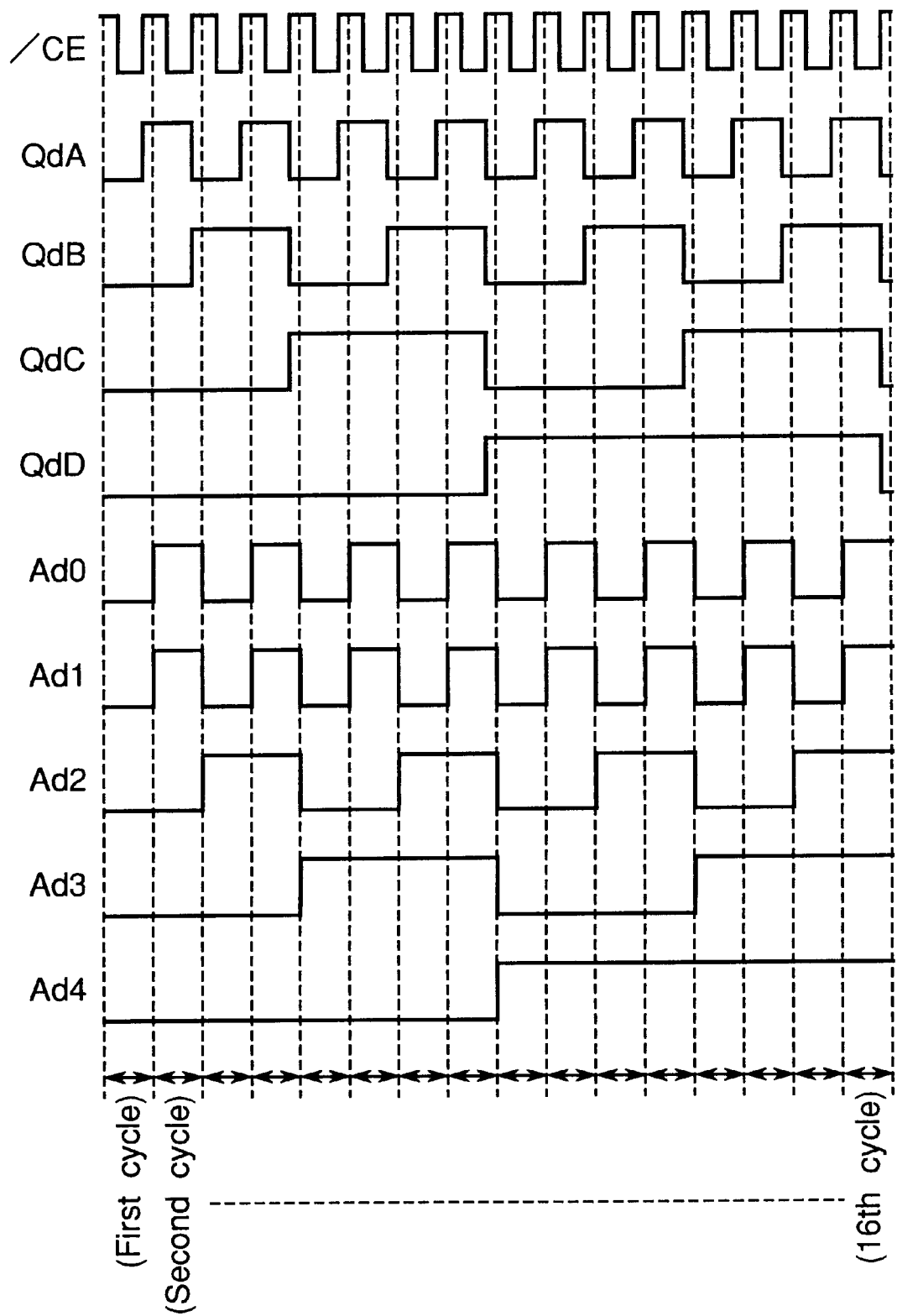
FIG. 12 is a timing chart illustrating signals at normal time in the security circuit section 6.

FIG. 12 is a timing chart illustrating signals at normal time in security circuit section 6. FIG. 12 shows the address data word Ad0 to Ad4 input to security circuit section 6 from host system apparatus 2, the signal /CE input to the clock input CLK of counter 42, and the data words QdA to QdD output from the outputs QA to QD of counter 42. In FIG. 12, it is assumed that the signal level of the address data bit Ad0 varies in every cycle. Changes in signal levels are shown for 16 cycles from the first to 16th cycle. Changes in the signal level of the address data bit Ad0 is made at HIGH level of the signal /CE. The first cycle starts, when power is turned on. In the first cycle, the reset signal /RES is input to counter 42 from power-supply control circuit 7, so that all the outputs QA to QD of counter 42 become LOW level.

First, the operation of each part of security circuit section 6 in the first cycle is described in the following. Only the data output S0 of the data outputs S0 to S15 of decoder IC 45 becomes LOW level, and the other data outputs S1 to S15 become HIGH level. Therefore, only the output OR0 of OR circuit 51 in all OR circuits 51 to 66 of comparison section 34 becomes LOW level, and the other outputs OR1 to OR15 of OR circuits 52 to 66 become HIGH level.

When power is turned on, a LOW level reset signal /RES is input from power-supply control circuit 7 to the reset input R of D flip-flop 71 in judgment circuit 35, so that the Q output of D flip-flop 86 becomes LOW level. At this time, in D flip-flops 71 to 86, only the clock input CLK of D flip flop 71 becomes LOW level, and the clock inputs CLK of the other D flip-flops 72 to 86 become HIGH level. At the same time, a LOW level address data bit Ad0 is input to inverter circuit 88, so that the Q output of D flip-flop 71 becomes HIGH level. Therefore, the Q output of D flip-flop 71 is latched at HIGH level from the second cycle onwards, since the clock input CLK changes from LOW to HIGH in the second cycle and remains at HIGH level. However, in the first cycle, the LOW level Q output of D flip-flop 86 is applied to one input of AND circuit 89.

In the second cycle, only the clock input CLK of D flip flop 72 becomes LOW level, and the clock inputs CLK of the other D flip-flops 71 and 73 to 86 become HIGH level. At the same time, the address data bit Ad0 changes from LOW to HIGH, so that the Q output of D flip-flop 72 becomes HIGH level. Therefore, the Q output of D flip-flop 71 is latched at HIGH level from the third cycle onwards, since the clock input CLK changes from LOW to HIGH in the third cycle and remains at HIGH level.

Similarly, from the third to 16th cycle, the Q outputs of D flip-flops 73 to 86 become successively to HIGH level. When the Q output of D flip-flop 86 is finally latched at HIGH level, the one input of AND circuit 89 becomes HIGH level, so that the memory-space select signal /REG input from host system apparatus 2 is output into card mode controller 13 through AND circuit 89. In this way, the security operation of security circuit section 6 is cancelled.

On the other hand, if the address data word Ad1 to Ad4 does not agree with the 4-bit data word QdA to QdD generated by counter 42 in at least one of the 16 cycles, then the Q output of D flip-flop 86 is latched at LOW level, so that a LOW level signal is input to card mode controller 13 from AND circuit 89, regardless of the memory-space select signal /REG input from host system apparatus 2. In this case, host system apparatus 4 cannot access common memory section 4.

As described above, in the IC memory card of the first embodiment in accordance with the present invention, security circuit section 6 permits access to common memory section 4 by host system apparatus 2, if the address data word Ad1 to Ad4 input from the host system apparatus during a predetermined number of cycles through address signal lines A1 to A4 agrees with a preset data word in every cycle. Security circuit section 6 prohibits access to common memory section 4 by host system apparatus 2, if the address data Ad1 to Ad4 does not agree with the preset data word in at least one cycle. In other words, if a signal having a predetermined pattern is not output during a predetermined number of cycles, then access to common memory section 4 is impossible. Therefore, the reading of data from memory or the writing of data into memory is not easily done, so that the security of data stored in the memory is enhanced. Further, security circuit section 6 can be composed of logic circuits. Therefore, the security function can be implemented with simple circuitry.

SECOND EMBODIMENT

In a second embodiment described in the following, the attribute memory section has a data storage area that stores security data at a predetermined address. The security data is then used as a password.

Figure 13:
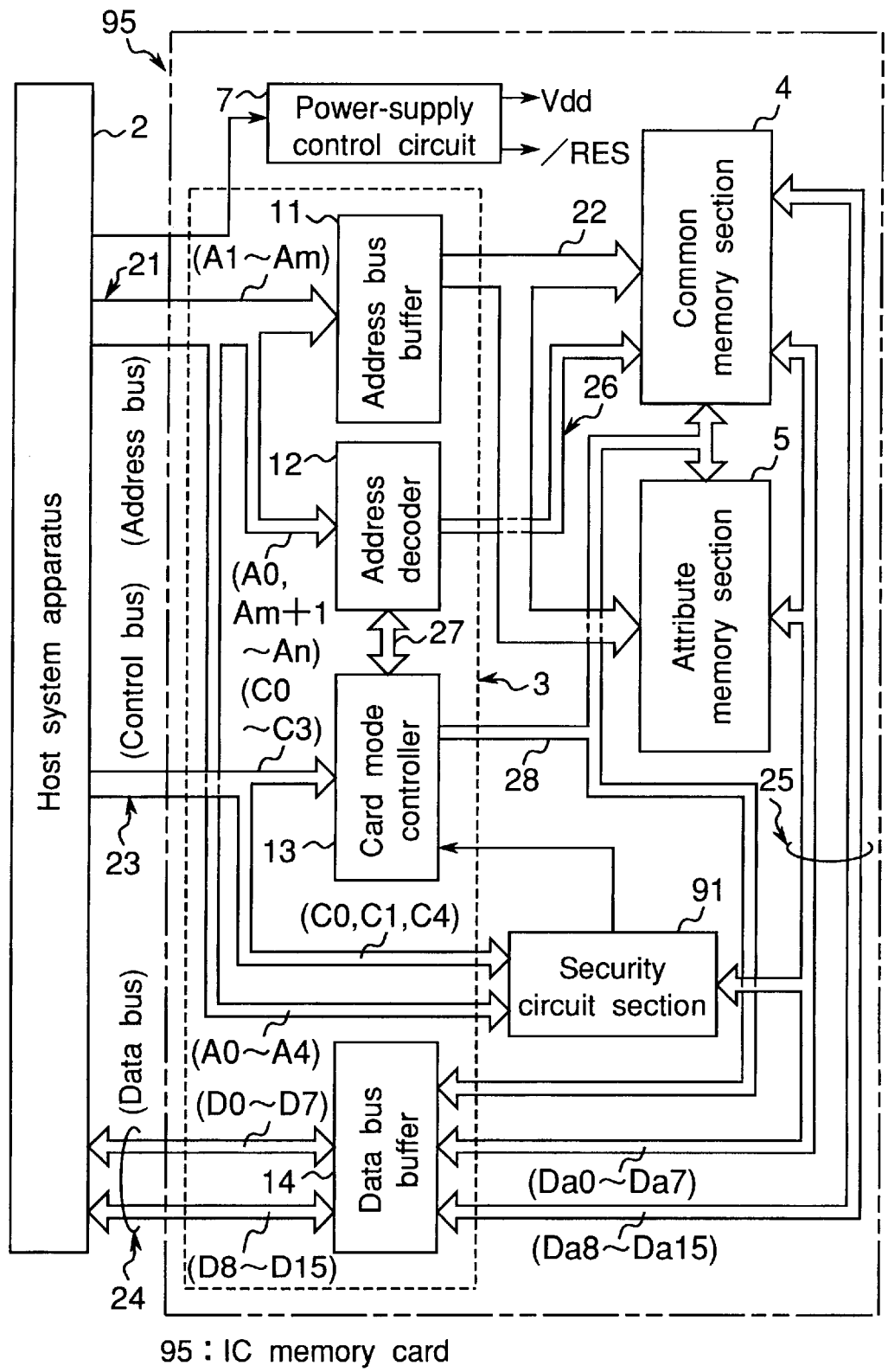
FIG. 13 is a block circuit diagram illustrating an IC memory card of a second embodiment in the present invention.

FIG. 13 is a block circuit diagram illustrating an IC memory card of the second embodiment. Those components identical with the ones in FIG. 1 are denoted by the same symbols, and their descriptions are omitted from here. Only those different from the ones in FIG. 1 are described in the following.

FIG. 13 differs from FIG. 1 in that the circuitry of the security circuit section is different. Referring to FIG. 13, an IC memory card 95 comprises an interface section 3, a common memory section 4, an attribute memory section 5, a security circuit section 91 that prohibits access to common memory section 4 by host system apparatus 2 unless a predetermined procedure is executed, and a power-supply control circuit 7 that provides to each section of IC memory card 95 the source power input from the outside and also generates and outputs a reset signal /RES.

Security circuit section 91 is connected to the host system apparatus 2 through control signal lines C0, C1, C3, C4 and address signal lines A1 to Am. Security circuit section 91 is also connected to attribute memory section 5 through internal data lines Da0 to Da7 and also connected to card mode controller 13.

Figure 14:
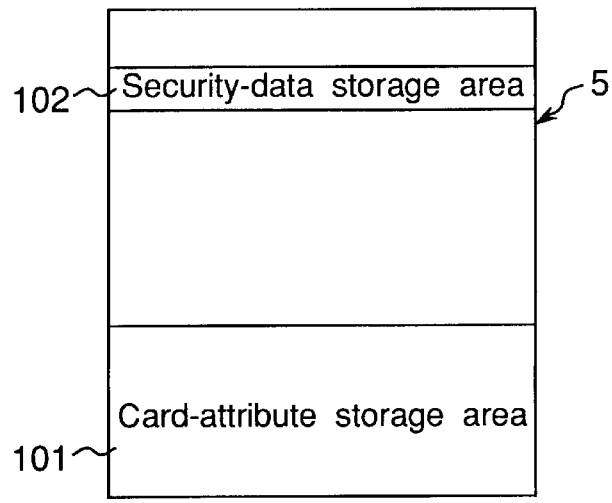
FIG. 14 illustrates the memory space of the attribute memory section 5 in FIG. 13.
Figure 15:
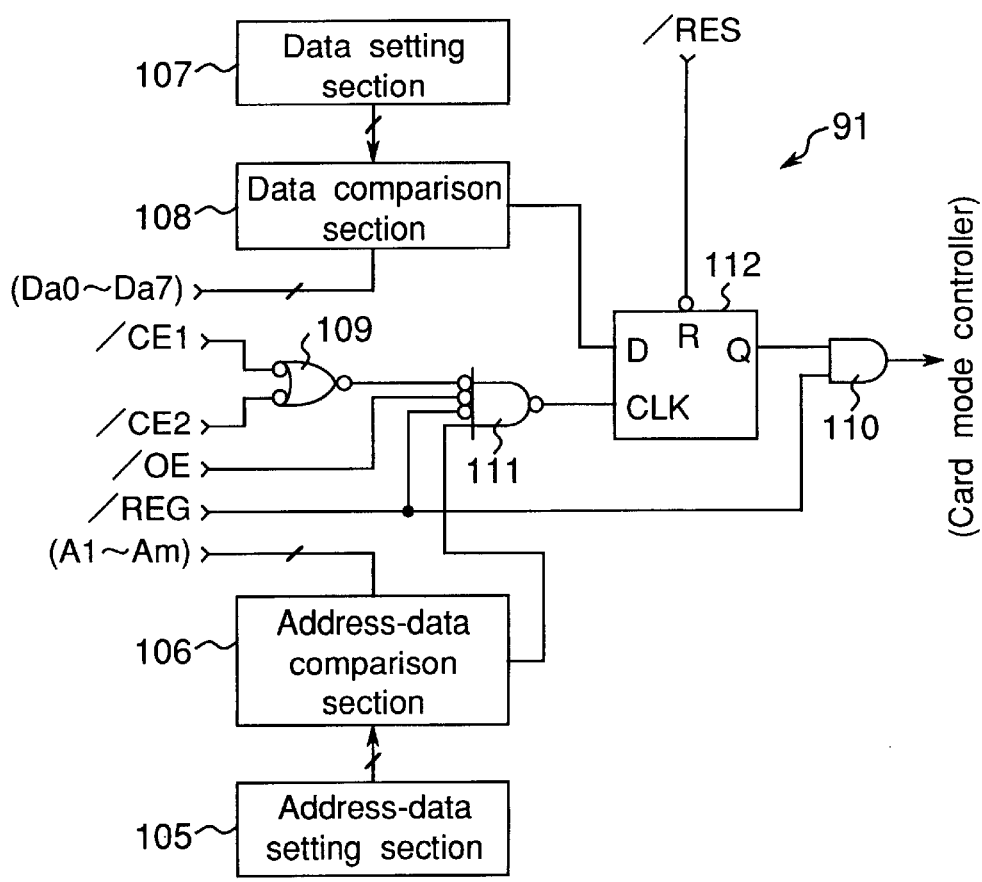
FIG. 15 is a block circuit diagram illustrating an example of the security circuit section 91 in FIG. 13.
Figure 16:
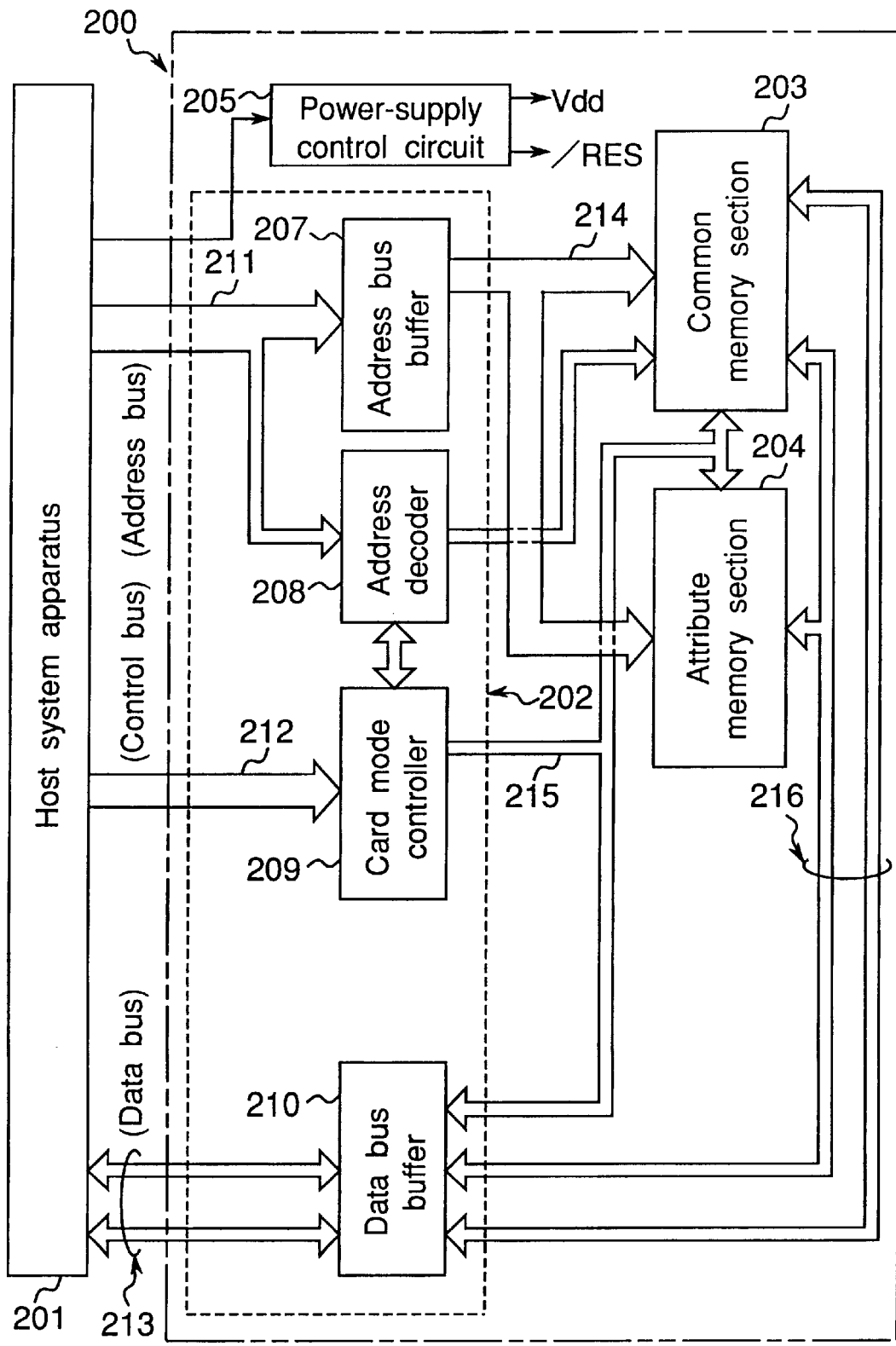
FIG. 16 is a block diagram illustrating a prior IC memory card.

FIG. 14 illustrates the memory space of the attribute memory section 5. Attribute memory section 5 has a card-attribute storage area 101 for storing attribute information about IC memory card 95, a security-data storage area 102 for storing predetermined security data. Security-data storage area 102 is located at a predetermined address of attribute memory section 5. FIG. 15 is a block circuit diagram illustrating an example of security circuit section 91. Referring to FIG. 15, security circuit section 91 has an address-data setting section 105 that sets predetermined address data for comparison to judge whether address data input from host system apparatus 2 is correct or not for indicating the location of security-data storage area 102, an address-data comparison section 106 that compares address data input from host system apparatus 2 with the address data set in address-data setting section 105.

Security circuit section 91 further has a data setting section 107 that sets security data for comparison to judge whether the security data read out from attribute memory section 5 by host system apparatus is correct or not, a data comparison section 108 that compares the data read out from attribute memory section 5 by host system apparatus 2 with the predetermined security data set in data setting section 107. Security circuit section also has AND circuits having 2 inputs 109, 110, a NAND circuit having 4 inputs 111, and a D flip-flop 112. Here, only one input of NAND circuit 111 is non-inverted input, and the other three inputs are inverted inputs.

The inputs of address-data comparison section 106 are applied to address signal lines A1 to Am and address data setting section 105. The output of address-data comparison section 106 is applied to the non-inverted input of NAND circuit 111. The inputs of data comparison section 108 are applied to internal data lines Da0 to Da7 and data setting section 107. The output of data comparison section 108 is applied to the D input of D flip-flop 112. One input of AND circuit 109 is applied to control signal line C0 and receives the card enable signal /CE1. The other input of AND circuit 109 is applied to control signal line C1 and receives the card enable signal /CE2.

In NAND circuit 111, one inverted input is applied to the output of AND circuit 109; the other two inverted inputs are respectively applied to control signal lines C3, C4 and respectively receive the output enable signal /OE and the memory-space select signal /REG. The output of NAND circuit 111 is applied to the clock input CLK of D flip-flop 112. The Q output of D flip-flop is applied to one input of AND circuit 110. The reset input R of D flip-flop 112 is connected to power-supply control circuit 7 and receives the reset signal /RES.

The other input of AND circuit 110 is connected to the host system apparatus 2 through control signal line C4 and receives the memory-space select signal /REG. The output of AND circuit 110 forms the output of security circuit section 91 and is connected to card mode controller 13. The data set in address data setting section 105 and data setting section 107 are formed by hardware. The data are set, for example, by using pull-up resistors and pull-down resistors and the like.

In the above construction, address-data comparison section 106 compares the address data word Ad1 to Adm input from host system apparatus 2 with the address data word for comparison set in address-data setting section 105. Address-data comparison section 106 outputs a HIGH level signal into the non-inverted input of NAND circuit 111, if the address data words agree with each other. Address-data comparison section 106 outputs a LOW level signal into the non-inverted input, if the address data words do not agree with each other. The output of AND circuit 109 becomes LOW level, if at least one of the card enable signals /CE1 and /CE2 is at low level. The output of AND circuit 109 becomes HIGH level, if both card enable signals /CE1 and /CE2 are at HIGH level.

The output of NAND circuit 111 becomes LOW level, if its non-inverted input becomes HIGH level, and if all its inverted inputs become LOW level. Usually, when the card enable signals /CE1, /CE2, memory-space select signal /REG, and output enable signal /OE output from host system apparatus 2 are all at LOW level, host system apparatus 2 is in the mode of reading data out from attribute memory section 5. When host system apparatus 2 is in the mode of reading data out from attribute memory section 5, and if address-data comparison section 106 outputs a HIGH level signal as its comparison result, that is, the address data words agree with each other, then NAND circuit 111 normally outputs a LOW level signal.

On the other hand, data comparison section 108 compares the data read out from attribute memory section 5 by host system apparatus 2 with the data for comparison set in data setting section 107. If they agree with each other, then data comparison section 108 outputs a HIGH level signal into the D input of D flip-flop 112. If they do not agree with each other, then data comparison section 108 outputs a LOW level signal into the D input of D flip-flop 112. The low level signal output from NAND circuit 111 is applied to the clock input CLK of D flip-flop 112. A figure illustrating the truth table of D flip-flop 112 is the same as FIG. 11.

Next, after the reading of data from attribute memory section 5, the clock input CLK of D flip-flop 112 changes from LOW into HIGH, so that the Q output is latched at HIGH level, which is the signal level of the D input at this time. Therefore, one input of AND circuit 110 becomes HIGH level, and the memory-space select signal /REG input from host system apparatus 2 is output into card mode controller 13 through AND circuit 110, so that the security operation by security circuit section 91 is cancelled.

On the other hand, suppose address-data comparison section 106 outputs a LOW level signal as its comparison result, that is, the address data words do not agree with each other, or address comparison section 108 outputs a LOW level signal as its comparison result, that is, the data words do not agree with each other. In this case, the Q output of D-flip-flop 112 is latched at LOW level. Then card mode controller 13 receives a LOW level signal from AND circuit 110, regardless of the memory-space select signal /REG input from host system apparatus 2, so that host system apparatus 2 cannot access common memory section 4.

In this way, the IC memory card of the second embodiment in accordance with the present invention has security-data storage area 102 at a predetermined address of attribute memory section 5 and prohibits and permits access to common memory section 4, depending on the comparison results. Security circuit section 91 permits access to common memory section 5, if the address data input from host system apparatus 2 agrees with the predetermined address data stored in security-data storage area 102 and if the data read out from attribute memory section 5 by host system apparatus agrees with the security data stored in security-data storage area 102. Otherwise, security circuit section 91 prohibits access to common memory section 4 by host system apparatus 2.

Consequently, in order to access common memory section 4, it is necessary that not only does the data read out from attribute memory section 5 by host system apparatus 2 agree with predetermined security data, but also the address data input from host system apparatus 2 agrees with the predetermined address data stored in security-data storage area 102. Therefore, the reading of data from memory or the writing of data into memory is not easily done, so that the security of data stored in the memory is enhanced, and the security function can be implemented with simple circuitry.

Although the present invention has been fully described in connection with the preferred embodiments thereof and the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An IC memory card used with a host system apparatus for processing information and having a memory for storing data, said IC memory card comprising:
   an interface section that interfaces with said host system apparatus;
   a common memory section that is formed of at least one IC memory and stores data; and
   a security circuit section that selectively prohibits and permits access to said common memory section, said security circuit section prohibiting access to said common memory section when address data input from said host system apparatus via said interface section in a predetermined number of cycles does not agree with preset data, and permitting access to said common memory section when address data input from said host system apparatus via said interface section in the predetermined number of cycles agrees with said preset data.

2. The IC memory card defined in claim 1, wherein said security circuit section includes;
   a data generating circuit that generates predetermined data for each cycle,
   a comparison circuit that compares, for each cycle, the data generated by said data generating circuit with the address data input from said host system apparatus to output the comparison result, and
   a judgment circuit that judges, based on the comparison results output from said comparison circuit, whether access to said common memory section should be prohibited or not.

3. The IC memory card defined in claim 2, wherein said data generating circuit is formed of a binary counter that counts based on a predetermined signal input from said host system apparatus.

4. The IC memory card defined in claim 2, wherein said comparison circuit includes;
   a first decoder that decodes the data generated by said data generating circuit,
   a second decoder that decodes the address data input from said host system apparatus, and
   a comparison section that compares in each cycle the data decoded by said first decoder with the data decoded by said second decoder to output the comparison result.

5. The IC memory card of claim 1, wherein said security circuit section receives said address data input from said host system apparatus via an address bus included in said interface section.

6. The IC memory card of claim 5, wherein said interface section includes:
   an address bus buffer for storing said address data input from said host system apparatus.

7. The IC memory card of claim 6, wherein said interface section further includes:
   a card mode controller for controlling access to said common memory section in accordance with an output of said security circuit section.

8. An IC memory card used with a host system apparatus for processing information and having a memory that stores data, said IC memory card comprising:
   an interface section that interfaces with said host system apparatus;
   a common memory section that is formed of at least one IC memory and stores data;
   an attribute memory section having a security-data storage area for storing predetermined security data and storing attribute information about said IC memory card; and
   a security circuit section that selectively prohibits and permits access to said common memory section, said security circuit section checking the address data input from said host system apparatus and also checking the data read out from said attribute memory section based on the checked address data, wherein
   said security circuit section permits access to said common memory section when the checked address data agrees with the address data that indicates the location of said security-data storage area and the read data agrees with said security data, and said security circuit section prohibits access to said common memory section when the checked address data does not agree with the address data that indicates the location of said security-data storage area or when the read data does not agree with said security data.

9. The IC memory card defined in claim 8, wherein said security circuit section prohibits access to said common memory section, unless a control signal for the reading data from said attribute memory section is input from said host system apparatus, when said address data is checked.

10. The IC memory card defined in claim 8, wherein said security circuit section includes;

an address-data setting section that sets predetermined address data indicating the location of said security-data storage area, an address-data comparison section that compares the address data input from said host system apparatus with the predetermined address data set in said address-data setting section to output the comparison results, a data setting section that sets predetermined security data, a data comparison section that compares the data read out from said attribute memory section based on the address data input from said host system apparatus with the predetermined security data set in said data setting section to output the comparison results, and a judgment circuit that judges whether or not to prohibit access to said common memory section, depending on the comparison results output from said address-data comparison section and said data comparison section.

11. The IC memory card defined in claim 10, wherein said judgment circuit prohibits access to said common memory section, unless a control signal for reading data from said attribute memory section is input from said system apparatus, when the comparison results are input from said address-data comparison section.

12. The IC memory card of claim 8, wherein said security circuit section receives said address data input from said host system apparatus via an address bus included in said interface section.

13. The IC memory card of claim 12, wherein said interface section includes:

an address bus buffer for storing said address data input from said host system apparatus.

14. The IC memory card of claim 13, wherein said interface section further includes:

a card mode controller for controlling access to said common memory section in accordance with an output of said security circuit section.

* * * * *